United States Patent [19]

Kim

[11] Patent Number: 5,674,757
[45] Date of Patent: Oct. 7, 1997

[54] PROCESS OF FABRICATING A SELF-ALIGNED THIN-FILM TRANSISTOR FOR A LIQUID CRYSTAL DISPLAY

[75] Inventor: Dong-Kyu Kim, Suwon, Rep. of Korea

[73] Assignee: Samsung Electronics Co., Ltd., Suwon, Rep. of Korea

[21] Appl. No.: 454,027

[22] Filed: May 30, 1995

[30] Foreign Application Priority Data

May 28, 1994 [KR] Rep. of Korea ............... 94-11722

[51] Int. Cl.$^6$ .................................................. H01L 21/336
[52] U.S. Cl. .................... 437/21; 437/41 TFI; 437/101; 437/229; 437/187; 437/909
[58] Field of Search ........................... 437/21, 40 TFI, 437/41 TFI, 101, 187, 909, 229

[56] References Cited

U.S. PATENT DOCUMENTS

| | | | |
|---|---|---|---|
| 4,700,458 | 10/1987 | Suzuki et al. | 437/41 TFI |
| 4,778,773 | 10/1988 | Sukegawa | 437/187 |
| 4,958,205 | 9/1990 | Takeda et al. | |
| 5,045,485 | 9/1991 | Tanaka et al. | 437/101 |
| 5,075,237 | 12/1991 | Wu | 437/40 |
| 5,091,337 | 2/1992 | Watanabe et al. | 437/41 |
| 5,137,841 | 8/1992 | Takeda et al. | 437/101 |
| 5,198,377 | 3/1993 | Kato et al. | 437/229 |
| 5,441,905 | 8/1995 | Wu | 437/101 |
| 5,532,180 | 7/1996 | Den Boer et al. | 437/40 TFI |

FOREIGN PATENT DOCUMENTS

| | | | |
|---|---|---|---|
| 2-62051 | 3/1990 | Japan | 437/40 TFI |
| 2-161734 | 6/1990 | Japan | 437/41 TFI |
| 3-192728 | 8/1991 | Japan | 437/41 TIF |
| 3-265141 | 11/1991 | Japan | 437/41 TFI |
| 6-204247 | 7/1994 | Japan | 437/41 TFI |

*Primary Examiner*—Mary Wilczewski
*Attorney, Agent, or Firm*—Cushman Darby & Cushman, IP Group of Pillsbury Madison & Sutro LLP

[57] ABSTRACT

A self-aligned thin-film transistor, fabricated by depositing a conductive layer on a transparent insulating substrate, etching the conductive layer so as to form a gate electrode together with gate lines, forming a triple layer having of a gate insulating layer, a semiconductor layer and an extrinsic semiconductor layer sequentially deposited over the substrate, etching the triple layer so that only a part thereof covering the gate electrode only remains to form an active pattern, depositing a transparent conductive layer over the substrate to form a drain electrode part by etching the transparent conductive layer so that a part of the transparent conductive layer remains overlapping the gate electrode, depositing a negative photoresist over the substrate, exposing the negative photoresist to a light supplied from the back of the transparent substrate opposite the gate and developing the thus-exposed photoresist, forming a drain electrode by removing the part of a transparent conductive layer appearing in a region over the gate wherefrom the photoresist is removed, depositing a conductive layer over the substrate to form a source electrode together with data lines by etching the conductive layer so that there remains a portion of the conductive layer opposite to the drain electrode with respect to the gate electrode, and removing a portion of the extrinsic semiconductor layer exposed over the gate electrode so as to form a channel.

10 Claims, 6 Drawing Sheets

PROCESS OF FABRICATING A SELF-ALIGNED THIN-FILM TRANSISTOR FOR A LIQUID CRYSTAL DISPLAY

TECHNICAL BACKGROUND

The present invention concerns a self-aligned thin-film transistor (TFT) for a liquid crystal display (LCD) and a process for fabricating it, wherein the drain electrode and/or the source electrode is aligned with the gate electrode.

Generally, amorphous silicon TFT should have a high field effect current mobility and parasitic capacitances which are as low as possible, in order to be used for an active matrix liquid crystal display (AM-LCD). The field effect current mobility of a conventional amorphous silicon TFT is about 0.3 to 1.0 cm$^2$/V$_s$, which is too small to design a large scale AM-LCD of high pixel density. If the channel width is increased to obtain a sufficient current, the area of the TFT is increased, so that the opening ratio for transmitting light through the LCD pixels is reduced.

Referring to FIGS. 1A and 1B, respectively illustrating cross-sectional views of a conventional channel-etch and etch-stopper TFT, parasitic capacitance will now be specifically described.

Deposited over a substrate 1 are a gate electrode 2, gate insulating layer 3, amorphous silicon semiconductor layer 4, channel protecting layer or etch stopper 5, contact layer 6, source electrode 7, and drain electrode 8. Generally the gate electrode 2 is overlapped by the source and drain electrodes to some extent. The overlapped length is indicated by ΔL in FIGS. 1A and 1B of the drawings. This overlap causes, compared to an ordinary MOSFET, the TFT to produce considerable parasitic capacitances C$_{gd}$ (between gate and drain electrodes) and C$_{gs}$ (between gate and source electrodes). The C$_{gd}$ causes the voltage drop of the pixels as the gate voltage drops from a high state to a low state. This voltage drop is called the offset voltage or kick-back, and is approximately expressed by the following equation:

$$\Delta V_p = \frac{C_{gd}}{C_{gd} + C_{ls} + C_s} \Delta V_g$$

When driving the liquid crystal by alternating current, the voltage applied to the pixels is reversed around the common voltage V$_{com}$ at every frame and in this case, the common voltage V$_{com}$ is lowered by the offset voltage ΔV$_p$ so as to maintain a balance between the main frame and the subframe. However, the liquid crystal capacitance C$_s$ is a function of the voltage, and therefore the balance is not precisely kept in the gray mode to produce a direct current thus resulting in flickering or persistance of images. Moreover, in order to reduce the difference of the offset voltages between gray modes and the absolute value of the offset voltage, the source capacitance C$_s$ is increased, which increases the opening ratio and the size of the TFT. To obviate this problem, conventionally there is provided an etch stopper TFT of half or wholly self-aligned type, as respectively shown in FIGS. 1C and 1D.

SUMMARY OF THE INVENTION

The object of the present invention is to provide a self-aligned TFT with reduced parasitic capacitances between the gate electrode and drain and source electrode.

According to an embodiment of the present invention, there is provided a process for fabricating a self-aligned thin-film transistor comprising the steps of:

depositing a conductive layer on a transparent insulating substrate;

etching the conductive layer so as to form a gate electrode together with gate lines;

forming a triple layer consisting of a gate insulating layer, a semiconductor layer and an extrinsic semiconductor layer sequentially deposited over the substrate;

etching the triple layer so that only a part covering the gate electrode remains, to form an active pattern;

depositing a transparent conductive layer over the substrate to form a drain electrode part by etching the transparent conductive layer so that a part of the transparent conductive layer remains overlapping the gate electrode;

depositing a negative photoresist over the substrate;

exposing the negative photoresist to a light supplied from the back of the transparent substrate opposite the gate and developing the thereby exposed photoresist;

forming a drain electrode by removing a part of the transparent conductive layer appearing in a region over the gate from which the photoresist is removed;

depositing a conductive layer over the substrate to form a source electrode together with data lines by etching the conductive layer so that there remains a portion of the conductive layer opposite to the drain electrode with respect to the gate electrode; and removing a portion of the extrinsic semiconductor layer exposed over the gate electrode so as to form a channel.

The gate electrode and gate lines may be made of aluminium and, in this case, the gate electrode is subjected to anodic oxidation. The amount of the drain electrode overlapping the gate electrode is determined, as required, by controlling the time of exposure to the light. The conductive layer deposited for the source electrode may be a transparent material and, in this case, the source electrode is aligned with the gate electrode as the drain electrode. Of course, the source electrode is formed simultaneously with the drain electrode. In order to secure the reliability of the TFT when it is used in an LCD, the gate insulating layer over the connecting pad for connecting the liquid crystal panel with the drive integrated circuit is etched before depositing the transparent conductive material, which is then deposited over the connecting pad. Thus, if the substrate deposited with the negative photoresist is exposed to the light supplied from the back of the substrate, the transparent conductive material remains over the connecting pad.

According to another embodiment of the present invention, a self-aligned TFT comprises:

a transparent insulating substrate;

a gate electrode and gate lines formed by etching a conductive layer deposited on a transparent insulating substrate;

a gate insulating layer deposited over the substrate with the gate electrode and gate lines;

a semiconductor layer deposited over the substrate so as to cover the gate electrode;

an extrinsic semiconductor layer deposited over the semiconductor layer so as to not cover a part of the semiconductor layer located directly over the gate electrode;

a drain electrode formed of a transparent conductive material so as to cover a part of the extrinsic semiconductor layer and a part of the gate insulating layer; and a source electrode and data lines formed of a conductive material so as to cover a part of the extrinsic semiconductor layer and a part of the gate insulating layer and to face toward the drain electrode.

The gate electrode and gate lines are preferably provided as a thin-film transparent conductive layer formed of aluminium, tantalum, chromium or titanium. In the case of aluminium, the gate electrode is subjected to anodic oxidation. Further, the gate insulating layer is preferably formed of silicon nitride or silicon oxide. Preferably, the semiconductor layer is formed of amorphous silicon and the extrinsic semiconductor layer of amorphous silicon doped with $n^+$. The source electrode and data lines may be formed of a transparent conductive material. When used in an LCD, the gate electrode and gate lines are preferably formed of aluminium and the connecting pad for connecting the liquid crystal panel with the drive integrated circuit is preferably formed of chromium.

The present invention will now be described more specifically with reference to the attached drawings, only by way of example.

BRIEF DESCRIPTION OF THE DRAWINGS

FIGS. 2A to 2E and 3A–3E illustrate, respectively in plan and in cross section, the steps of fabricating a self-aligned TFT together with the mask patterns according to an embodiment of the present invention.

DETAILED DESCRIPTION OF THE PREFERRED EMBODIMENT

Figure 1A:
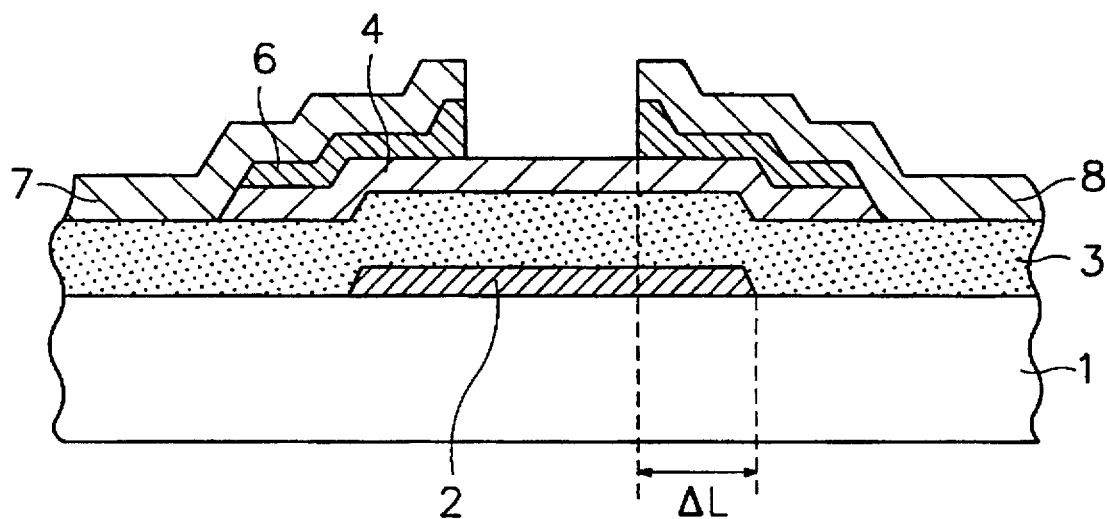
FIG. 1A is a cross sectional view of a conventional channel etch TFT.
Figure 1B:
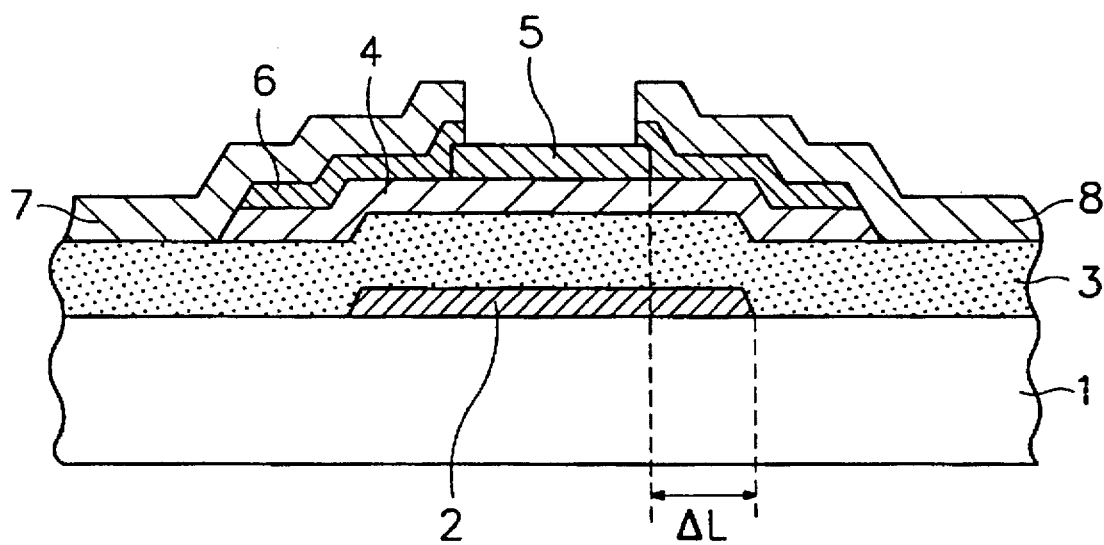
FIG. 1B is a cross sectional view of a conventional etch stopper TFT.
Figure 1C:
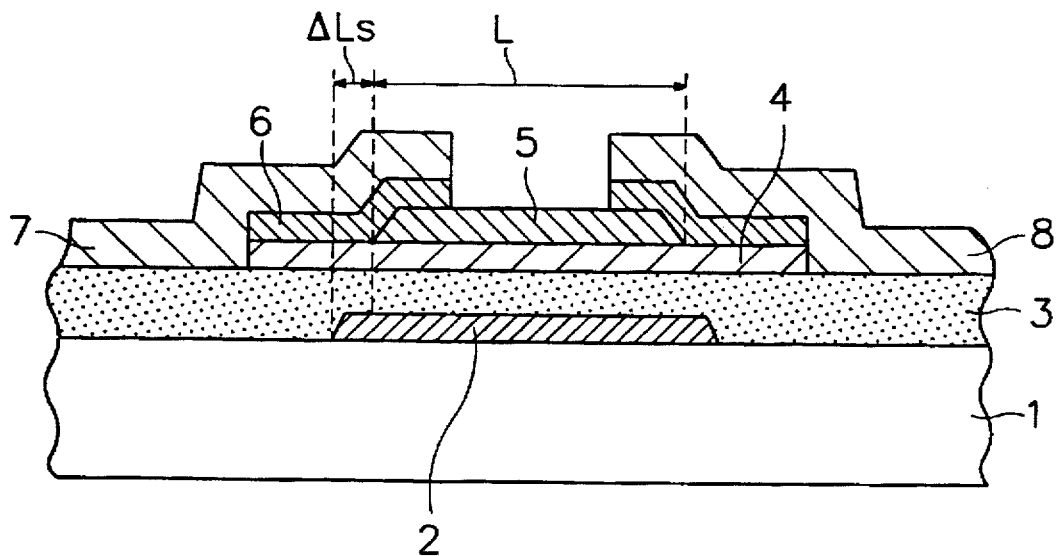
FIG. 1C is a cross sectional view of a conventional etch stopper TFT of a half self-aligned type.
Figure 1D:
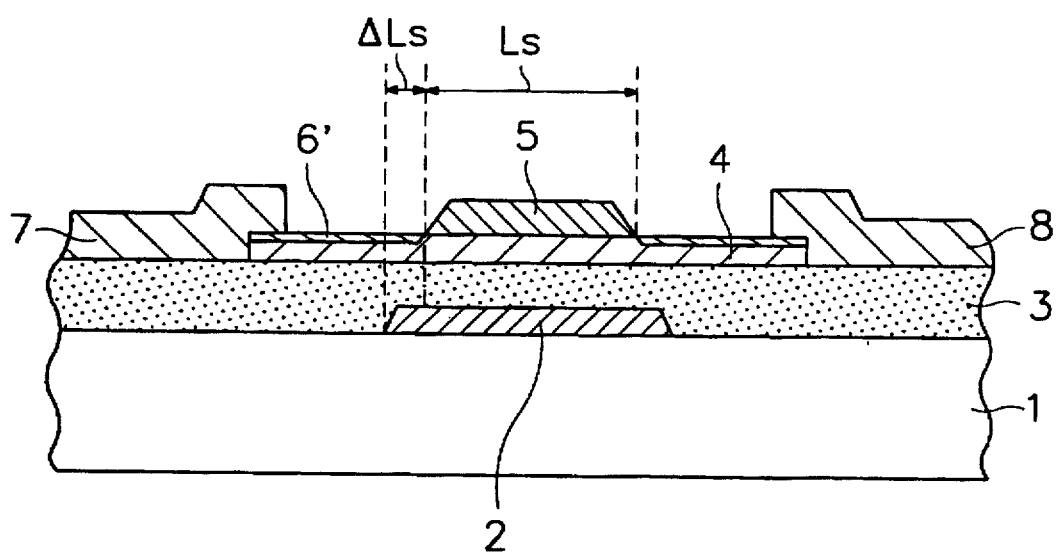
FIG. 1D is a cross sectional view of a conventional etch stopper TFT of a wholly self-aligned type.
Figure 2A:
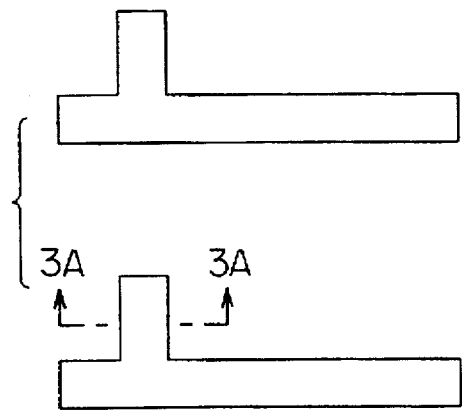
Figure 2B:
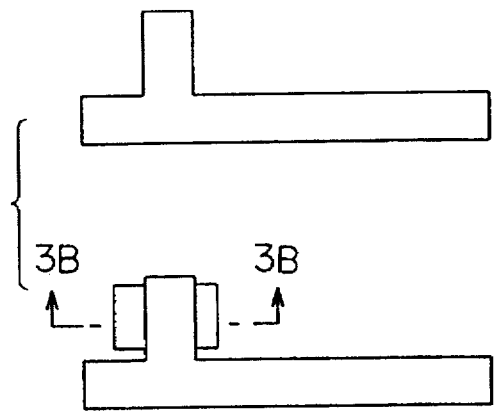
Figure 2C:
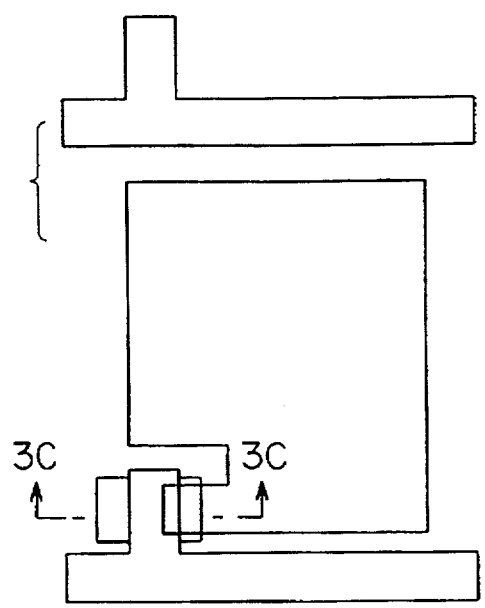
Figure 2D:
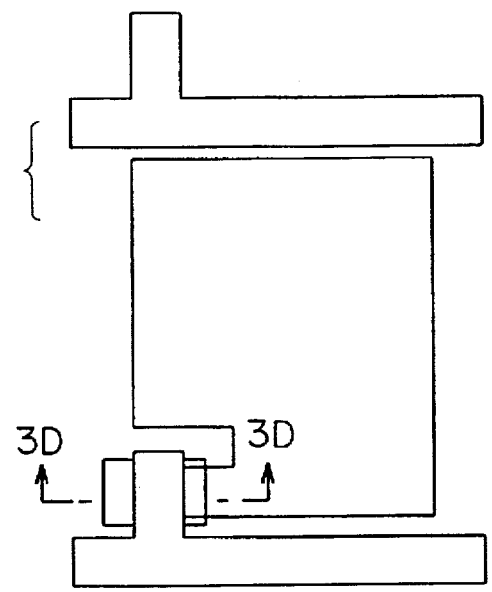
Figure 2E:
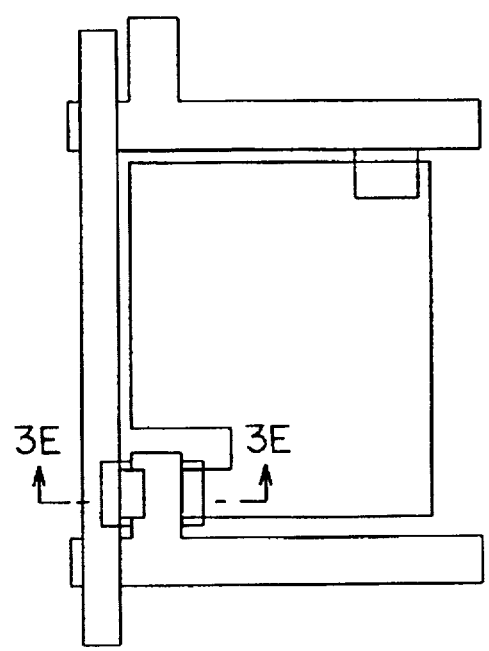
Figure 3A:
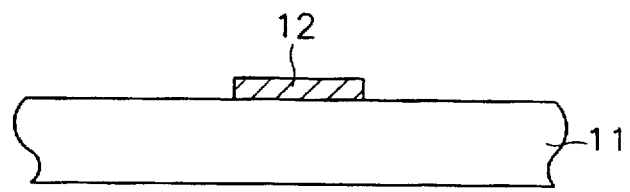
Figure 3B:
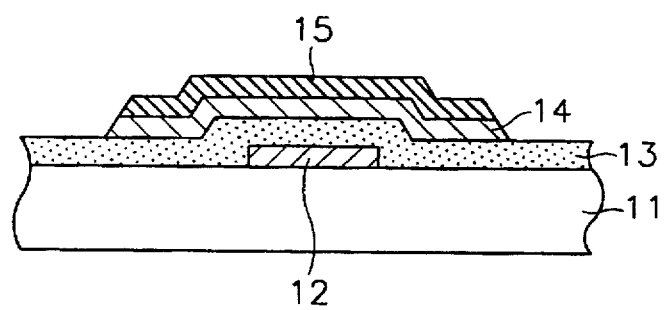
Figure 3B:
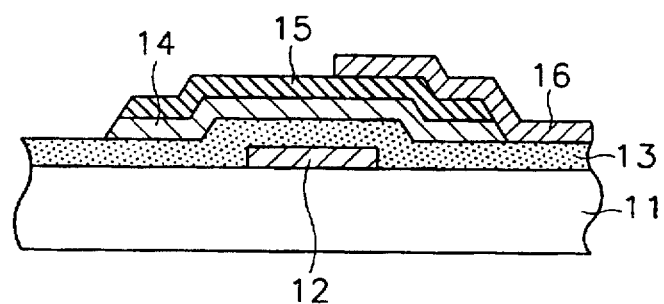
Figure 3B:
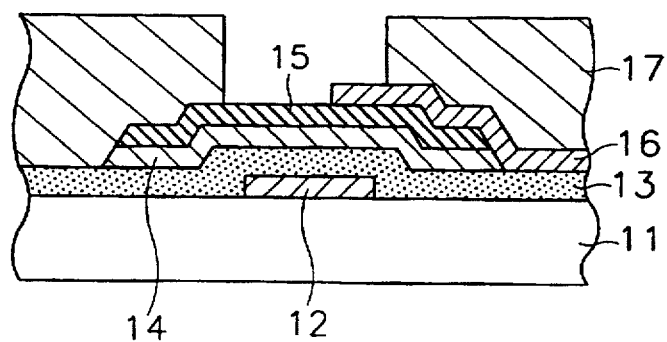

FIGS. 2A to 2E and 3A to 3E, respectively illustrate the mask patterns, of successive stages in manufacture of a self-aligned TFT embodying principles of the present invention and cross sections taken along lines 3A—3A, 3B—3B, 3C—3C, 3D—3D and 3E—3E. As shown in FIGS. 2A and 3A, a conductive material is deposited on a transparent substrate 11 and etched to form a gate electrode 12 and gate lines. The gate electrode is an opaque thin film with a thickness of 1,000 Å to 5,000 Å formed of aluminium, tantalum, chromium or titanium. Then, sequentially deposited over the substrate are a gate insulating layer 13, a semiconductor layer 14 and a extrinsic semiconductor layer 15 using the process of chemical vapour deposition (CVD). The extrinsic semiconductor 15 and semiconductor layer 14 are etched to form an active pattern while maintaining the part over the electrode 12. Generally, the gate insulating layer 13 is a thin film with a thickness of 1,000 Å to 5,000 Å, formed of silicon nitride (SiNx) or silicon oxide (SiOx). The semiconductor layer 14 is a thin film with a thickness of 500 Å to 2000 Å, formed of amorphous silicon. The extrinsic semiconductor layer 15 is a thin film with a thickness of about 500 Å, formed of amorphous silicon doped with $n^+$.

Then, as shown in FIGS. 2C and 3C–a, transparent conductive layer such as ITO is deposited to have a thickness of about 500 Å and etched to form a drain electrode part 16 overlapping the gate electrode 12. A negative photoresist 17 is deposited over the substrate, which is then exposed to the light supplied from the back of the substrate opposite to the position of the gate electrode 12, as shown in FIG. 3Cb.

In this case, the gate electrode 12 serves as a mask for aligning the gate electrode with the drain electrode. Developed, there is removed the portion of the photoresist directly over the gate electrode. The amount of the drain electrode overlapping the gate electrode is determined, as required, by controlling the time of exposure to the light.

Figure 3D:
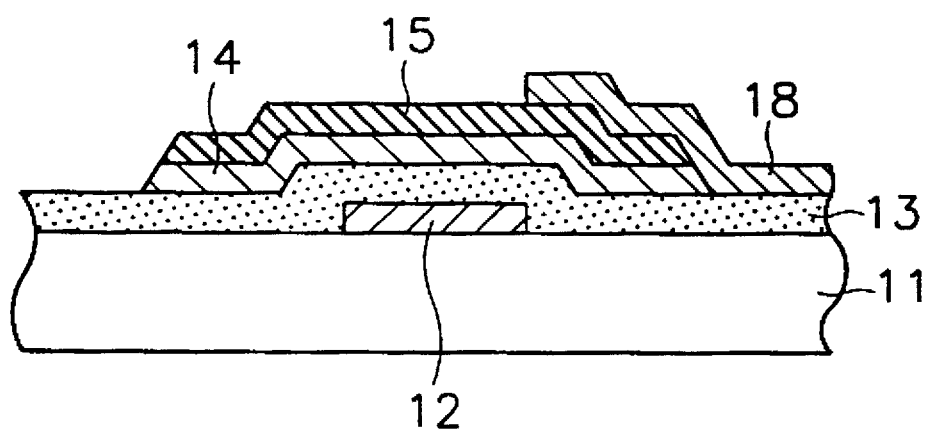
Figure 3E:
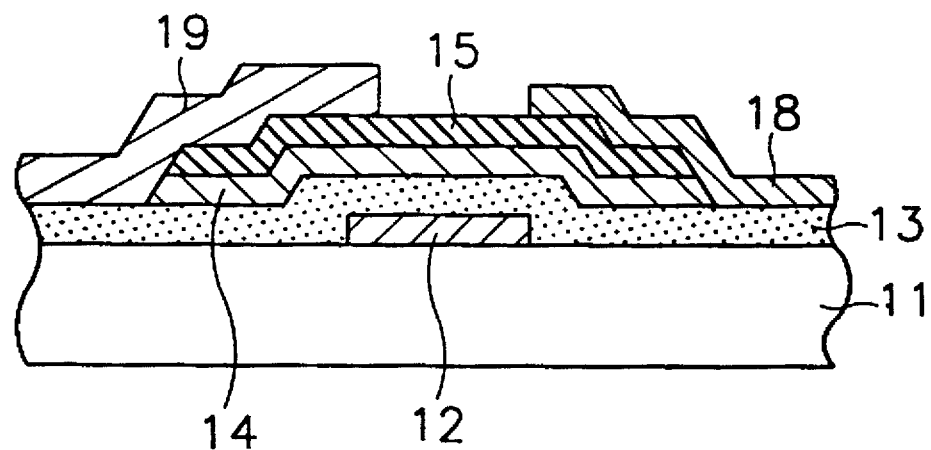

Then, as shown in FIGS. 2D and 3D, the exposed portion of the drain electrode part 16 is etched away to complete the drain electrode and the remaining photoresist 17 is removed. A source electrode 19 and data lines are formed opposite to the drain electrode 18 with respect to the gate electrode 12 by patterning a conductive material deposited over the substrate, as shown in FIGS. 2E and 3E. The conductive material may be transparent, and, in this case, the source electrode may be aligned with the gate electrode as the drain electrode. Namely, a transparent conductive layer such as ITO is deposited and etched to form a source electrode part overlapping the gate electrode 12. A negative photoresist is deposited over the substrate, which is then exposed to the light supplied from the back of the substrate opposite to the position of the gate electrode 12. In this case, the gate electrode 12 serves as a mask for aligning the gate electrode with the source electrode. Developed, there is removed the portion of the photoresist directly over the gate electrode. The amount of the source electrode overlapping the gate electrode is determined, as required, by controlling the time of exposure to the light. The portion exposed of the source electrode part 16 is etched away to complete the source electrode 19, and the remaining photoresist 17 is removed. Of course, the source electrode may be formed simultaneously with the drain electrode. As shown by the hatched portion 20 in FIG. 3E, a supplementary capacitance Cs may be formed simultaneously with the source electrode and data lines. The extrinsic semiconductor in the channel region is etched by using a conventional process such as dry etching.

What is claimed is:

1. A process for fabricating a self-aligned thin-film transistor comprising the steps of:

depositing a conductive layer on a transparent insulating substrate;

etching said conductive layer so as to form a gate electrode together with gate lines;

forming a triple layer consisting of a gate insulating layer, a semiconductor layer and an extrinsic semiconductor layer sequentially deposited over said substrate;

etching said triple layer so that only a part thereof covering said gate electrode remains to form an active pattern;

depositing a transparent conductive layer over said substrate to form a drain electrode part by etching said transparent conductive layer so that a part of said transparent conductive layer remains overlapping said gate electrode;

depositing a negative photoresist over said substrate;

exposing said negative photoresist to a light supplied from the back of said transparent substrate opposite said gate and developing the thus-exposed negative photoresist;

forming a drain electrode by removing a part of said transparent conductive layer appearing in a region over said gate from which said photoresist is removed;

depositing a conductive layer over said substrate to form a source electrode together with data lines, by etching said conductive layer so that there remains a portion of said conductive layer opposite to said drain electrode with respect to said gate electrode; and removing a portion of said extrinsic semiconductor layer exposed over said gate electrode so as to form a channel.

2. A process for fabricating a self-aligned thin-film transistor as defined in claim 1, wherein the conductive layer used for forming said gate electrode and gate lines is aluminum.

3. A process for fabricating a self-aligned thin-film transistor as defined in claim 2, further comprising the step of subjecting said gate electrode to anodic oxidation.

4. A process for fabricating a self-aligned thin-film transistor as defined in claim 1, wherein the amount of said drain electrode overlapping said gate electrode is determined by controlling the duration of exposure of said negetive photoresist to said light.

5. A process for fabricating a self-aligned thin-film transistor as defined in claim 1, wherein said conductive layer used for forming said source electrode is a transparent material.

6. A process for fabricating a self-aligned thin-film transistor as defined in claim 5, wherein the step of forming said source electrode further comprises the steps of:

depositing a transparent conductive material over said substrate to form a source electrode part by etching said transparent conductive layer so that a part of said transparent conductive layer remains overlapping said gate electrode;

depositing a negative photoresist over said substrate;

exposing said negative photoresist to a light supplied from the back of said transparent substrate opposite said gate and developing said negative photoresist; and forming a source electrode by removing the part of said transparent conductive layer appearing in a region over said gate from which said photoresist is removed.

7. A process for fabricating a self-aligned thin-film transistor as defined in claim 6, wherein the amount of said source electrode overlapping said gate electrode is determined by controlling the duration of exposure of said negetive photoresist to said light.

8. A process for fabricating a self-aligned thin-film transistor comprising the steps of:

depositing a conductive layer on a transparent insulating substrate;

etching said conductive layer so as to form a gate electrode together with gate lines;

forming a triple layer consisting of a gate-insulating layer, a semiconductor layer and an extrinsic semiconductor layer sequentially deposited over said substrate;

etching said triple layer so that only a part thereof covering said gate electrode only remains to form an active pattern;

depositing a transparent conductive layer over said substrate to form a drain and source electrode parts by etching said transparent conductive layer so that two parts of said transparent conductive layer remain facing each other with a space between them and overlapping said gate electrode;

depositing a negative photoresist over said substrate;

exposing said negative photoresist to a light supplied from the back of said transparent substrate opposite said gate and developing the thus-exposed negative photoresist;

forming a drain and source electrodes by removing the parts of said transparent conductive layer appearing in a region over said gate from which said photoresist is removed; and removing a portion of said extrinsic semiconductor layer exposed over said gate electrode so as to form a channel.

9. A process for fabricating a self-aligned thin-film transistor as defined in claim 8, wherein the amount of said source and drain electrodes overlapping said gate electrode is determined by controlling the duration of exposure of said negetive photoresist to said light.

10. A process for fabricating a self-aligned thin-film transistor comprising the steps of:

depositing a conductive layer on a transparent insulating substrate;

etching said conductive layer so as to form a gate electrode together with gate lines;

forming a triple layer consisting of a gate insulating layer, a semiconductor layer and an extrinsic semiconductor layer sequentially deposited over said substrate;

etching said triple layer so that only a part thereof covering said gate electrode only remains to form an active pattern;

etching the gate insulating layer of a connecting pad for connecting a drive integrated circuit with a liquid crystal substrate;

depositing a transparent conductive layer over said substrate to form a drain electrode part by etching said transparent conductive layer so that a part of said transparent conductive layer remains overlapping said gate electrode and a part of said transparent conductive layer over said connecting pad is not etched;

depositing a negative photoresist over said substrate;

exposing said negative photoresist to a light supplied from the back of said transparent substrate opposite said gate and developing the thus-exposed negative photoresist;

forming a drain electrode by removing the part of said transparent conductive layer appearing in a region over said gate from which said photoresist is removed;

depositing a conductive layer over said substrate to form a source electrode together with data lines by etching said conductive layer so that there remains a portion of said conductive layer opposite to said drain electrode with respect to said gate electrode; and removing a portion of said extrinsic semiconductor layer exposed over said gate electrode so as to form a channel.

* * * * *